United States Patent
Omura

(10) Patent No.: US 7,459,945 B2
(45) Date of Patent: Dec. 2, 2008

(54) GATE DRIVING CIRCUIT AND GATE DRIVING METHOD OF POWER MOSFET

(75) Inventor: Ichiro Omura, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 2 days.

(21) Appl. No.: 11/189,704

(22) Filed: Jul. 27, 2005

(65) Prior Publication Data

US 2006/0034114 A1 Feb. 16, 2006

(30) Foreign Application Priority Data

Aug. 11, 2004 (JP) .............................. 2004-234085

(51) Int. Cl.
*H03K 3/00* (2006.01)
(52) U.S. Cl. .................. 327/108; 327/109; 327/110
(58) Field of Classification Search .................. None
See application file for complete search history.

(56) References Cited

U.S. PATENT DOCUMENTS

| | | | | |
|---|---|---|---|---|
| 4,864,479 A | * | 9/1989 | Steigerwald et al. | 363/17 |
| 5,994,929 A | * | 11/1999 | Sano et al. | 327/111 |
| 6,433,985 B1 | * | 8/2002 | Voldman et al. | 361/113 |
| 6,545,886 B1 | * | 4/2003 | Ireland | 363/56.02 |
| 2004/0239401 A1 | * | 12/2004 | Liao | 327/423 |

FOREIGN PATENT DOCUMENTS

| JP | 5-207731 | | 8/1993 |
|---|---|---|---|
| JP | 10-52061 | * | 2/1998 |
| JP | 11-308084 | | 11/1999 |

OTHER PUBLICATIONS

A Resonant MOSFET Gate Drive With Complete Energy Recovery, Yuhui Chen, Center for Power Electronics System.*
Herman L.N. Wiegman, "A Resonant Pulse Gate Drive For High Frequency Applications", Applied Power Electronics Conference and Exposition, Feb. 23, 1992, pp. 738-743.
Yuhui Chen et al., "A Resonant MOSFET Gate Driver with Complete Energy Recovery", Power Electronics and Motion Control Conference, vol. 1, 2000, pp. 402-406.

(Continued)

*Primary Examiner*—Tuan T Lam
*Assistant Examiner*—Hiep Nguyen
(74) *Attorney, Agent, or Firm*—Oblon, Spivak, McClelland, Maier & Neustadt, P.C.

(57) ABSTRACT

A gate driving circuit and method which increases the switching frequency by use of a switching control circuit which controls operations of a first, second, third, and fourth switches. The switching control circuit performs switching control of a power MOSFET when the MOSFET is to be turned on, so that a period exists when the first and fourth switches are simultaneously ON. The switching circuit also performs switching control when a MOSFET is to be turned off, so that a period exists when the second and third switches are simultaneously ON.

26 Claims, 11 Drawing Sheets

OTHER PUBLICATIONS

Kaiwei Yao et al., "A Novel Resonant Gate Driver for High Frequency Synchronous Buck Converter", Applied Power Electronics Conference and Exposition, vol. 1, 2001, pp. 280-286.

Kaiwei Yao et al., "A Novel Resonant Gate Driver for High Frequency Synchronous Buck Converters", IEEE Transactions on Power Electronics, vol. 17, No. 2, Mar. 2002, pp. 180-186.

Dragan Maksimovic, "A Mos Gate Drive With Resonant Transitions", Power Electronics Specialists Conference, Jun. 24-27, 1991, pp. 527-532.

R. J. Leedham et al., "Design of a High Speed Power MOSFET Driver and Its Use in a Half-Bridge Converter", Power Electronics and Applications, 1993, Sep. 13-16, 1993, vol. 2, pp. 407-412.

* cited by examiner (TIME t1 TO TIME t2)

(TIME t2 TO TIME t3)

(TIME t3 TO TIME t4)

(TIME t4 TO TIME t5)

(TIME t5 TO TIME t6)

(TIME t7 TO TIME t8)

(TIME t8 TO TIME t9)

(TIME t9 TO TIME t10)

(TIME t10 TO TIME t11)

(TIME t11 TO TIME t12)

GATE DRIVING CIRCUIT AND GATE DRIVING METHOD OF POWER MOSFET

CROSS REFERENCE TO RELATED APPLICATION

This application is based upon and claims benefit of priority under 35 USC §119 from the Japanese Patent Application No. 2004-234085, filed on Aug. 11, 2004, the entire contents of which are incorporated herein by reference.

BACKGROUND OF THE INVENTION

The present invention relates to a gate driving circuit and gate driving method of a power MOSFET.

To drive the gate of a power MOSFET in, e.g., the power supply of a CPU, it is essential to increase the switching frequency.

FIG. 18 shows an example of a gate driving circuit of a conventional power MOSFET. A MOSFET M1 in the output stage has a drain connected to a power supply voltage $V_{CC}$ terminal, a source connected to a ground voltage $V_{SS}$ terminal, and a gate connected to a resistor Rg which prevents an excess gate current.

A constant input voltage Vin is applied between input terminals 101 and 102. Switching elements SW1 and SW2 are connected in series between the input terminals 101 and 102. A capacitance element C and series-connected diodes D1 and D2 are connected in parallel with the switching elements SW1 and SW2. The connecting point of the switching elements SW1 and SW2 and the connecting point of the diodes D1 and D2 are connected to the gate of the MOSFET M1 via the resistor Rg.

References disclosing conventional gate driving circuits are as follows.

Reference 1: A resonant pulse gate drive for high frequency applications Wiegmen, H. L. N.; Applied Power Electronics Conference and Exposition, 1992. APEC '92. Conference Proceedings 1992., Seventh Annual, 23-27 Feb. 1992 Page(s): 738-743

Reference 2: A resonant MOSFET gate driver with complete energy recovery Yuhui Chen; Lee, F. C.; Amoroso, L.; Ho-Pu Wu; Power Electronics and Motion Control Conference, 2000. Proceedings. PIEMC 2000. The Third International, Volume: 1, 2000 Page(s): 402-406 vol. 1

Reference 3: A novel resonant gate driver for high frequency synchronous buck converter Yao, K.; Lee, F. C.; Applied Power Electronics Conference and Exposition, 2001. APEC 2001. Sixteenth Annual IEEE, Volume: 1, 2001 Page(s): 280-286 vol. 1

Reference 4: A novel resonant gate driver for high frequency synchronous buck converters Kaiwei Yao; Lee, F. C.; Power Electronics, IEEE Transactions on, Volume: 17 Issue: 2, March 2002 Page(s): 180-186

Reference 5: A MOS gate driver with resonant transitions Maksimovic, D.; Power Electronics Specialists Conference, 1991. PESC '91. Record., 22nd Annual IEEE, 24-27 Jun. 1991 Page(s): 527-532

Reference 6: Design of a high speed power MOSFET driver and its use in a half-bridge converter Leedham, R. J.; McMahon, R. A.; Power Electronics and Applications, 1993., Fifth European Conference on, 13-16 Sep. 1993. Page(s): 407-412 vol. 2

Reference 7: Japanese Patent Laid-Open No. 10-52061

Reference 8: Japanese Patent Laid-Open No. 5-207731

Reference 9: Japanese Patent Laid-Open No. 11-308084

FIG. 19 shows losses with respect to the input power in the conventional gate driving circuit as shown in FIG. 18. The losses include a loss caused by gate driving and a conduction loss. The gate driving loss depends on the frequency.

In the conventional gate driving circuit as shown in FIG. 19, the gate driving loss increases as the frequency rises. When the loss increases, the heat generation amount also increases, so a countermeasure for heat radiation is necessary. As a consequence, the size of the whole apparatus increases.

Accordingly, it is conventionally impossible to reduce the driving loss when the frequency is raised.

The gate of a MOSFET has a capacitor structure. In principle, therefore, the gate structure of a MOSFET does not singly generate any loss. A loss is produced by the gate resistor Rg in the gate driving circuit and the parasitic resistance in the circuit. The value of the loss is $f \times C_g \times V_g^2$ where $C_g$ is the gate capacitance.

If, therefore, the energy consumed by the gate resistor Rg and the wiring resistance can be regenerated, the loss can be effectively prevented at high frequencies. However, this cannot be well done in the conventional circuit.

Also, the maximum value of the gate current of the MOSFET M1 is determined by gate voltage Vg/gate resistor Rg, so it cannot be changed to any desired value in accordance with the situation. Since the gate current gradually increases, the gate voltage transition time, i.e., a so-called Miller time prolongs. This increases the switching loss of the MOSFET to be driven.

Furthermore, in the conventional circuit, an electric current is supplied to the gate of the MOSFET M1 via the resistor Rg, so the gate voltage is not fixed at a low impedance. Consequently, the gate voltage varies when the high-side switching element SW1 and low-side switching element SW2 are alternately turned on, so the circuit may cause faulty operations. In relation to this drawback, the circuit is readily influenced by EMI.

SUMMARY OF THE INVENTION

According to one aspect of the present invention, there is provided a gate driving circuit of a power MOSFET, comprising:

a first capacitance element connected in series between a first power supply terminal and ground terminal;

a first switch connected in series between said first power supply terminal and a first node;

a second switch connected in series between said first node and ground terminal;

a first diode connected in parallel with said first switch, and having a cathode connected to said first power supply terminal and an anode connected to said first node;

a second diode connected in parallel with said second switch, and having a cathode connected to said first node and an anode connected to said ground terminal;

an inductance element connected in series between said first node and a second node;

a third switch connected in series between said first power supply terminal and second node;

a fourth switch connected in series between said second node and ground terminal;

a third diode connected in parallel with said third switch, and having a cathode connected to said first power supply terminal and an anode connected to said first node;

a fourth diode connected in parallel with said fourth switch, and having a cathode connected to said second node and an anode connected to said ground terminal; and a switching control circuit which controls ON/OFF operations of each of said first, second, third, and fourth switches, wherein in order to drive a power MOSFET having a drain and source connected between a second power supply terminal and said ground terminal, and a gate -connected to said second node, said switching control circuit performs switching control, when said power MOSFET is to be turned on, such that a period during which said first and fourth switches are simultaneously ON exists, and performs switching control, when said power MOSFET is to be turned off, such that a period during which said second and third switches are simultaneously ON exists.

According to one aspect of the present invention, there is provided a gate driving circuit of a power MOSFET, comprising:

a first capacitance element connected in series between a first power supply terminal and ground terminal;

a first switch connected in series between said first power supply terminal and a first node;

a second switch connected in series between said first node and ground terminal;

a first diode connected in parallel with said first switch, and having a cathode connected to said first power supply terminal and an anode connected to said first node;

a second diode connected in parallel with said second switch, and having a cathode connected to said first node and an anode connected to said ground terminal;

an inductance element connected in series between said first node and a second node;

a third switch connected in series between said first power supply terminal and second node;

a fourth switch connected in series between said second node and ground terminal;

a third diode connected in parallel with said third switch, and having a cathode connected to said first power supply terminal and an anode connected to said first node;

a fourth diode connected in parallel with said fourth switch, and having a cathode connected to said second node and an anode connected to said ground terminal; and a switching control circuit which controls ON/OFF operations of each of said first, second, third, and fourth switches, wherein in order to drive a power MOSFET having a drain and source connected between a second power supply terminal and said ground terminal, and a gate connected to said second node, when said power MOSFET is to be turned on, said switching control circuit turns on said fourth switch, and turns on said second switch with said fourth switch being kept ON, thereby supplying a first electric current to said inductance element to store energy having a first polarity, turns off said fourth switch when the first electric current has reached a first predetermined value, thereby raising a gate voltage of said power MOSFET by the first-polarity energy stored in said inductance element, turns on said third switch, and turns off said first switch to regenerate the first-polarity energy stored in said inductance element, and when said power MOSFET is to be turned off, said switching control circuit turns on said second switch with said third switch being kept ON, thereby supplying a second electric current to said inductance element in a direction different from the first electric current and storing energy having a second polarity, turns off said third switch when the second electric current has reached a second predetermined value, thereby dropping the gate voltage of said power MOSFET by the second-polarity energy stored in said inductance element, turns on said fourth switch, and turns off said first switch to regenerate the second-polarity energy stored in said inductance element.

According to one aspect of the present invention, there is provided a gate driving method of a power MOSFET, which drives a power MOSFET by using a gate driving circuit comprising:

a first capacitance element connected in series between a first power supply terminal and ground terminal;

a first switch connected in series between the first power supply terminal and a first node;

a second switch connected in series between the first node and ground terminal;

a first diode connected in parallel with the first switch, and having a cathode connected to the first power supply terminal and an anode connected to the first node;

a second diode connected in parallel with the second switch, and having a cathode connected to the first node and an anode connected to the ground terminal;

an inductance element connected in series between the first node and a second node;

a third switch connected in series between the first power supply terminal and second node;

a fourth switch connected in series between the second node and ground terminal;

a third diode connected in parallel with the third switch, and having a cathode connected to the first power supply terminal and an anode connected to the first node;

a fourth diode connected in parallel with the fourth switch, and having a cathode connected to the second node and an anode connected to the ground terminal; and a switching control circuit which controls an ON/OFF operations of each of the first, second, third, and fourth switches, the power MOSFET having a drain and source connected between a second power supply terminal and the ground terminal, and a gate connected to the second node, wherein the switching control circuit performs switching control, when the power MOSFET is to be turned on, such that a period during which the first and fourth switches are simultaneously ON exists, and performs switching control, when the power MOSFET is to be turned off, such that a period during which the second and third switches are simultaneously ON exists.

BRIEF DESCRIPTION OF THE DRAWINGS

FIG. 3 is a view showing a circuit operation when a power MOSFET in the gate driving circuit is to be turned on;

FIG. 4 is a view showing a circuit operation when a power MOSFET in the gate driving circuit is to be turned on;

FIG. 5 is a view showing a circuit operation when a power MOSFET in the gate driving circuit is to be turned on;

FIG. 6 is a view showing a circuit operation when a power MOSFET in the gate driving circuit is to be turned on;

FIG. 7 is a view showing a circuit operation when a power MOSFET in the gate driving circuit is to be turned on;

DETAILED DESCRIPTION OF THE INVENTION

Embodiments of the present invention will be described below with reference to the accompanying drawings.

(1) FIRST EMBODIMENT

A gate driving circuit and gate driving method of a power MOSFET according to the first embodiment of the present invention will be explained below.

Figure 1:
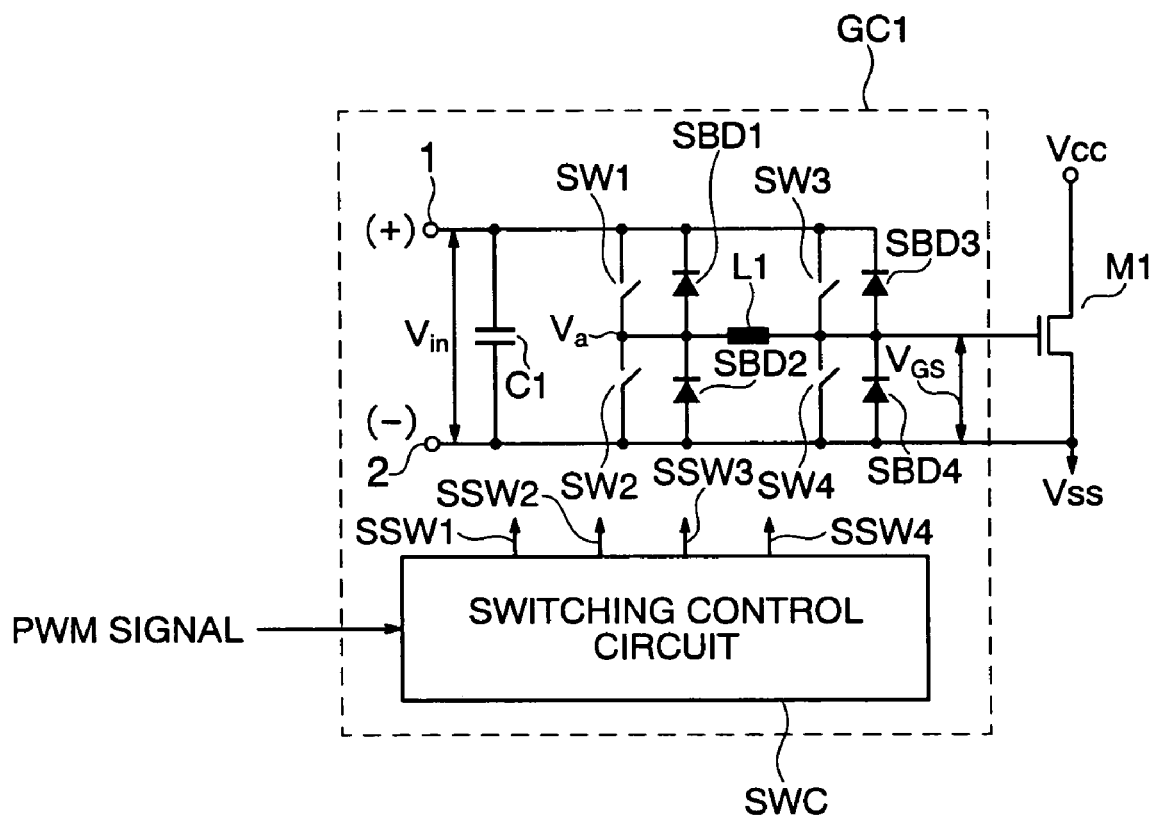
FIG. 1 is a circuit diagram showing the configuration of a gate driving circuit according to the first embodiment of the present invention.

FIG. 1 shows the configuration of the power MOSFET and its gate driving circuit according to the first embodiment.

This gate driving circuit includes a bridge circuit comprising four switching elements SW1 to SW4 each of which is a MOSFET or bipolar transistor, four Schottky barrier diodes SBD1 to SBD4, and an inductance element L1. Some or all of these elements may also be formed on an IC (Integrated Circuit).

A constant voltage Vin is input between input terminals 1 and 2, and a capacitance element C1 is connected between the input terminals 1 and 2.

The switching elements SW1 and SW2 are connected in series between the input terminals 1 and 2. In parallel with the switching elements SW1 and SW2, the switching elements SW3 and SW4 are connected in series between the input terminals 1 and 2.

The connecting point of the switching elements SW1 and SW2 is connected to the anode of the Schottky barrier diode SBD1, the cathode of the Schottky barrier diode SBD2, and one terminal of the inductance element L1.

The connecting point of the switching elements SW3 and SW4 is connected to the anode of the Schottky barrier diode SBD3, the cathode of the Schottky barrier diode SBD4, and the other terminal of the inductance element L1.

The cathodes of the Schottky barrier diodes SBD1 and SBD3 are connected to the input terminal 1, and the anodes of the Schottky barrier diodes SBD2 and SBD4 are connected to the input terminal 2.

The connecting point of the switching elements SW3 and SW4 is connected to the gate of a power MOSFET M1 without any resistor between them. The MOSFET M1 has a drain connected to a power supply voltage $V_{CC}$ terminal, and a source connected to a ground voltage $V_{SS}$ terminal.

A switching control circuit SWC receives a PWM (Pulse Width Modulation) signal, and generates switching control signals SSW1 to SSW4 for controlling ON/OFF operations of the switching elements SW1 to SW4.

Figure 2:
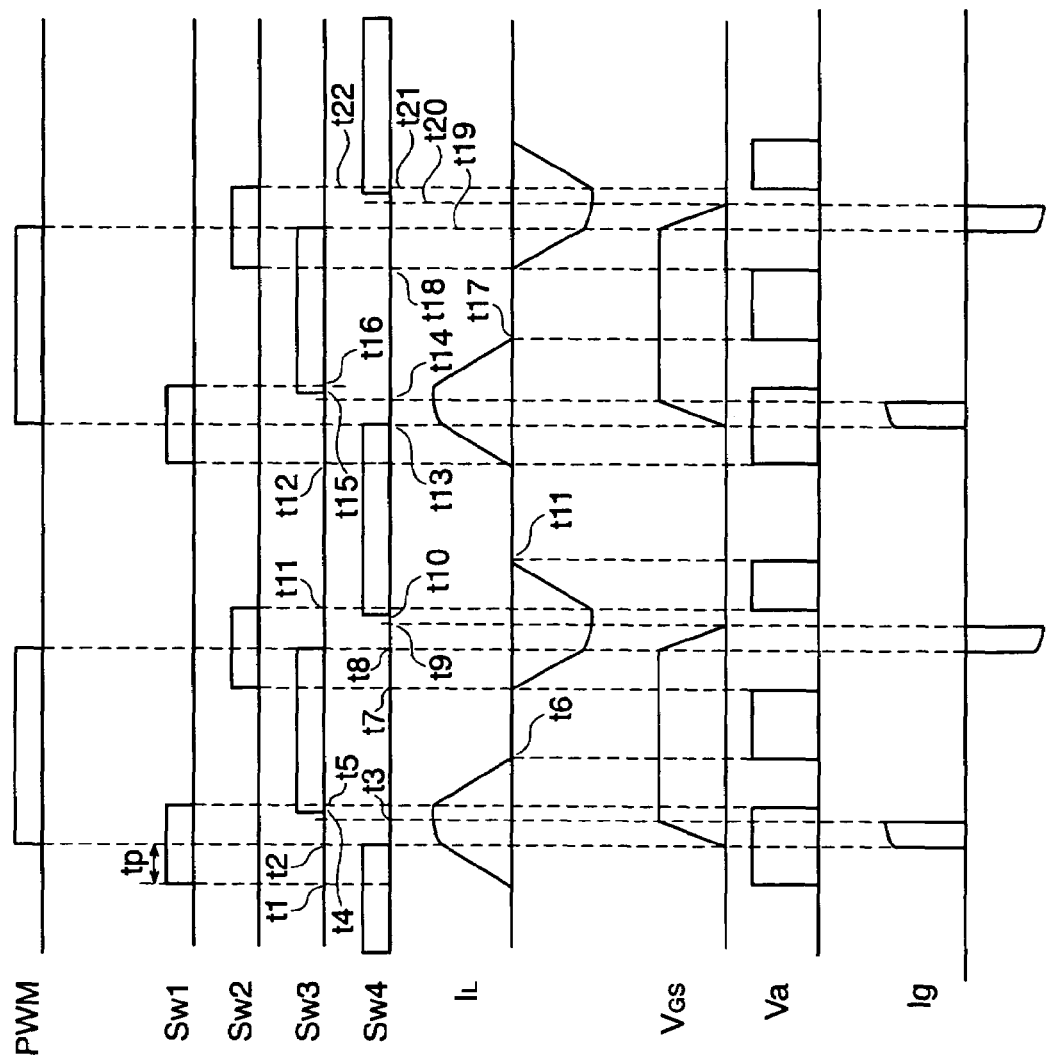
FIG. 2 is a timing chart showing the operation waveform of each signal in the gate driving circuit.

The driving timings of the gate driving circuit according to the first embodiment having the above arrangement will be explained below with reference to a timing chart in FIG. 2.

(1) To turn on MOSFET M1

1) First, the switching element SW4 is turned on.

2) With the switching element SW4 kept ON, the switching element SW1 is turned on at time t1.

Figure 3:
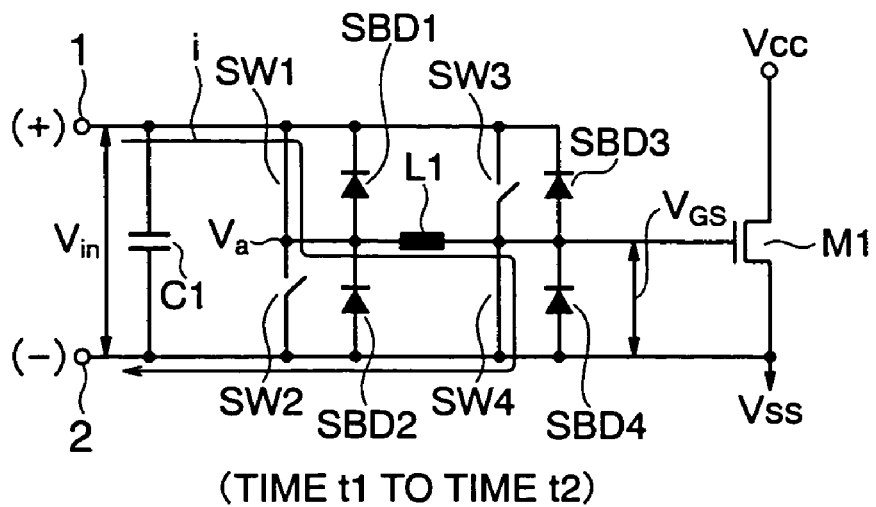

Consequently, an electric current i flows through the inductance element L1 in a direction indicated by the arrow shown in FIG. 3, and energy ($=Li^2/2$) is stored.

3) The switching element SW4 is turned off at time t2 when the electric current of the inductance element L1 has reached a gate current, i.e., a desired value to be supplied to the gate-to-source path of the MOSFET M1. A period from the turning-on (time t1) of the switching element SW1 to the turning-off (time t2) of the switching element SW4 is determined by Ig*L/Vin where Ig is the value of an electric current to be supplied to the gate electrode.

Figure 4:
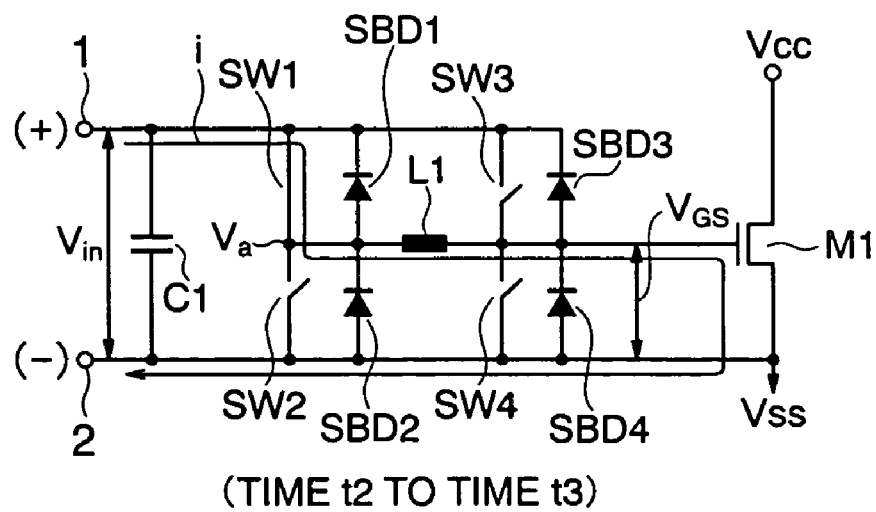
Figure 18:
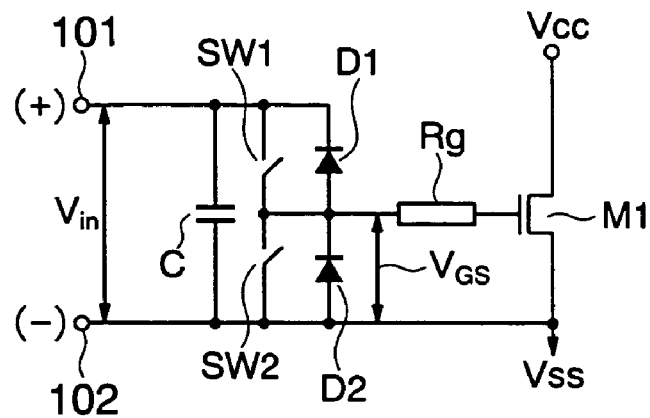
FIG. 18 is a circuit diagram showing the configuration of a conventional gate driving circuit.
Figure 19:
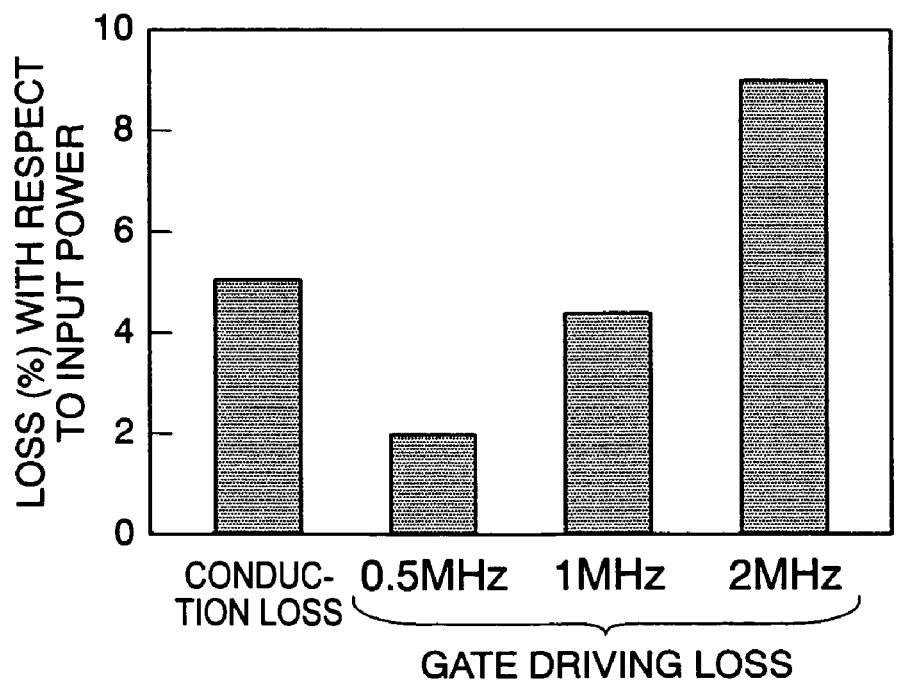
FIG. 19 is a graph showing the relationship between the gate driving loss and frequency in the conventional gate driving circuit.

4) As shown in FIG. 4, the electric current i flowing through the inductance L1 flows to the gate of the MOSFET M1, and a gate voltage $V_{GS}$ rises. The rate of the rise is higher than that in the conventional circuit shown in FIG. 18. That is, the Miller time shortens. Further, the loss of the gate resistance $Rg*i^2$ is not generated by the current i. From time t2 to time t3, an electric current Ig is supplied to the gate of the MOSFET M1 and stored in the gate capacitor, and the gate voltage $V_{GS}$ rises.

Figure 5:
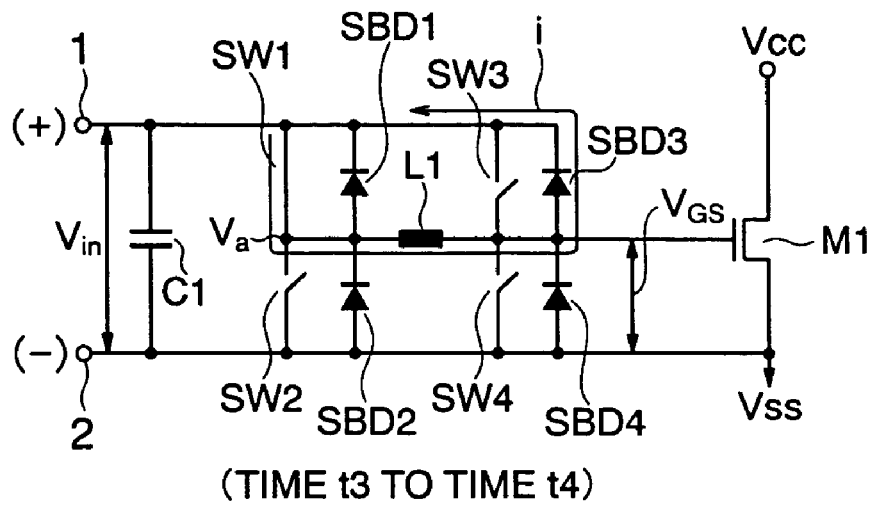

5) When the gate voltage $V_{GS}$ has reached the input voltage Vin at time t3, as shown in FIG. 5, the electric current i is commutated to the Schottky barrier diode SBD3 connected in parallel with the switching element SW3.

Figure 6:
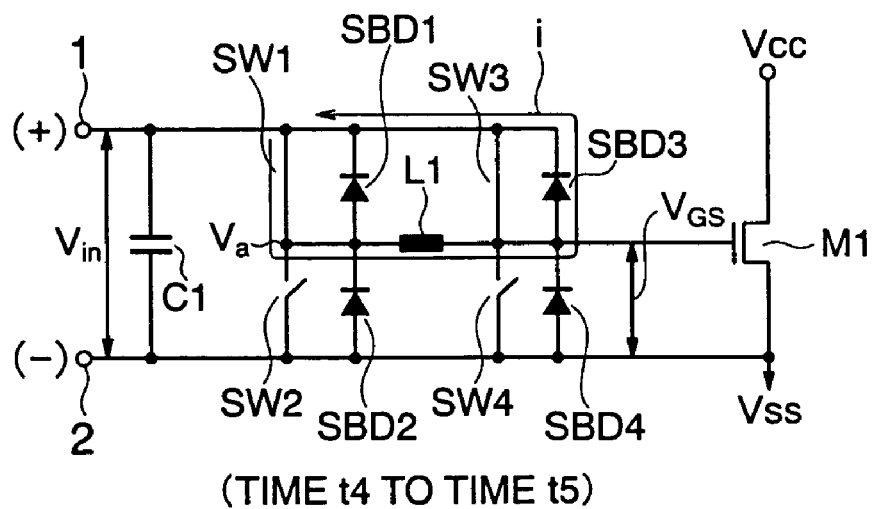

6) The switching element SW3 is turned on at time t4 during the period in which the electric current is commutated to the Schottky barrier diode SBD3. As shown in FIG. 6, the gate voltage $V_{GS}$ is fixed at the same level as the input voltage Vin at a low impedance. At this time, the current i flows through both of the switching element SW3 and the Schottky barrier diode SBD3, so that the resistance decreases.

7) The switching element SW1 is turned off at time t5 immediately after the switching element SW3 is turned on, i.e., immediately after the start of commutation.

Figure 7:
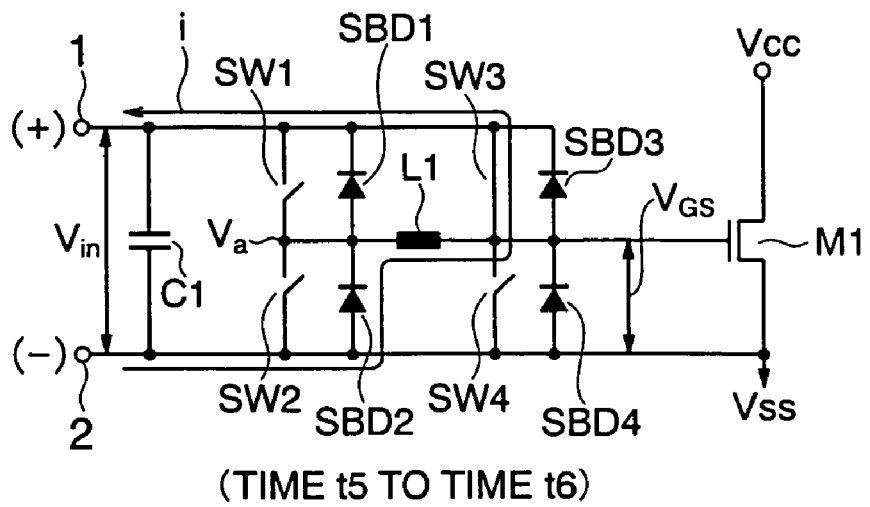

8) The state shown in FIG. 7 is obtained from time t5 to time t6. In this period, the energy stored in the inductance L1 is regenerated until an electric current $I_L$ of the inductance L1 no longer flows.

Turning off the MOSFET M1 can be similarly controlled by replacing the switching element SW1 with the switching element SW2, and the switching element SW4 with the switching element SW3, in the turning-on sequence described above.

2) To turn off MOSFET M1

1) At time t7, the switching element SW3 is already ON.

2) With the switching element SW3 kept ON, the switching element SW2 is turned on at time t7.

Figure 8:
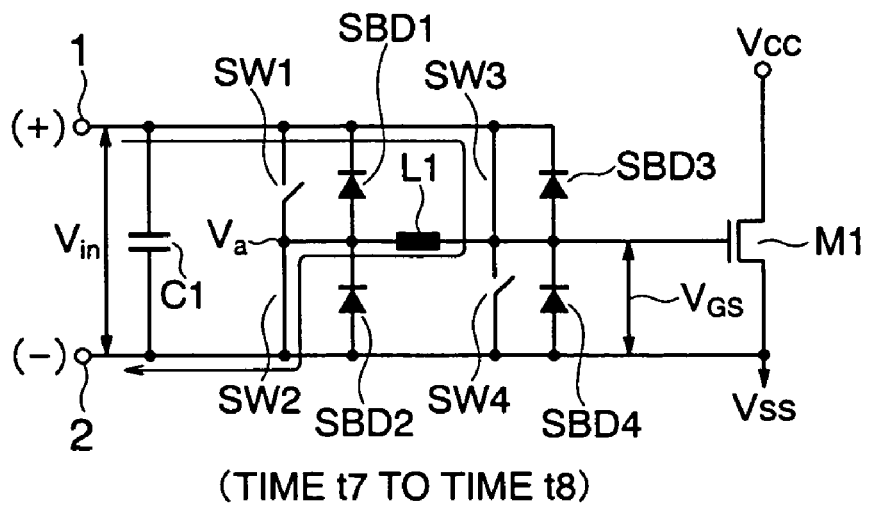
FIG. 8 is a view showing a circuit operation when a power MOSFET in the gate driving circuit is to be turned off.

Consequently, a negative electric current i flows through the inductance element L1 in a direction indicated by the arrow shown in FIG. 8, and negative energy (=−Li²/2) is stored.

3) The switching element SW3 is turned off at time t8 when the electric current of the inductance element L1 has reached the gate current, i.e., the desired value supplied to the gate-to-source path of the MOSFET M1.

Figure 9:
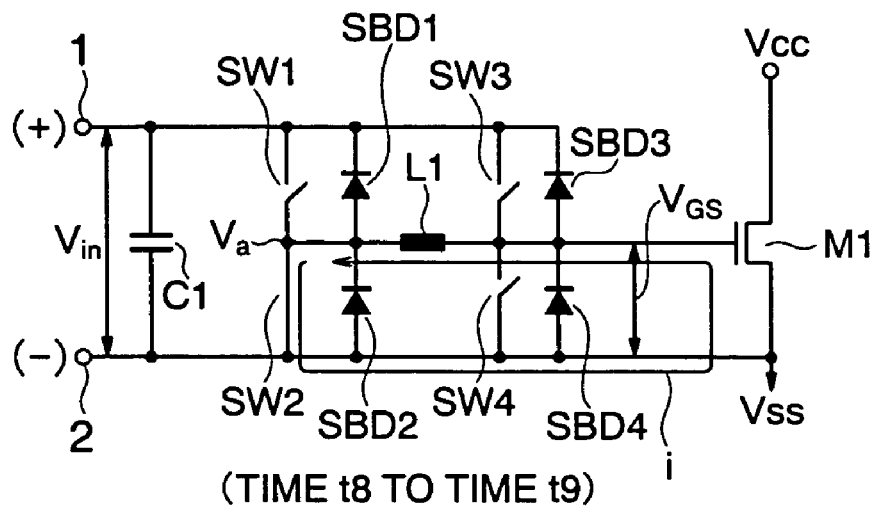
FIG. 9 is a view showing a circuit operation when a power MOSFET in the gate driving circuit is to be turned off.

4) As shown in FIG. 9, the negative electric current i flowing through the inductance L1 draws the electric charge stored in the capacitor structure of the gate of the MOSFET M1, and the gate voltage $V_{GS}$ drops.

Figure 10:
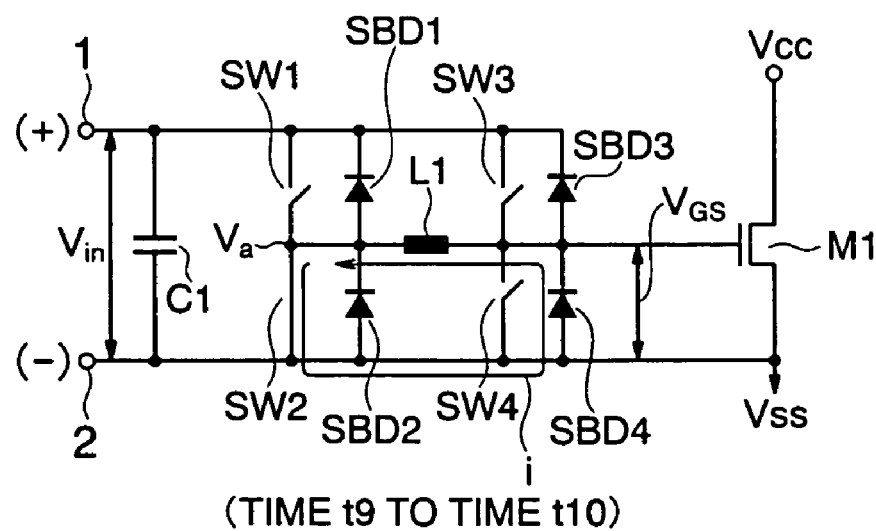
FIG. 10 is a view showing a circuit operation when a power MOSFET in the gate driving circuit is to be turned off.

5) When the gate voltage $V_{GS}$ has dropped to the ground voltage $V_{SS}$ at time t9, as shown in FIG. 10, the electric current i is commutated to the Schottky barrier diode SBD4 connected in parallel with the switching element SW4.

Figure 11:
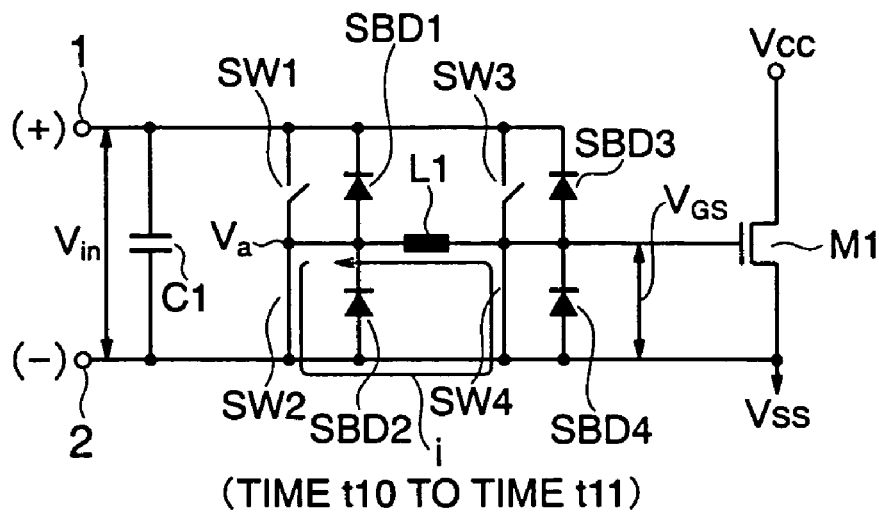
FIG. 11 is a view showing a circuit operation when a power MOSFET in the gate driving circuit is to be turned off.

6) The switching element SW4 is turned on at time t10 during the period in which the electric current is commutated to the Schottky barrier diode SBD4. As shown in FIG. 11, the gate voltage $V_{GS}$ is fixed at the same level as the ground voltage $V_{SS}$ at a low impedance.

7) The switching element SW2 is turned off at time t11 immediately after the switching element SW4 is turned on.

Figure 12:
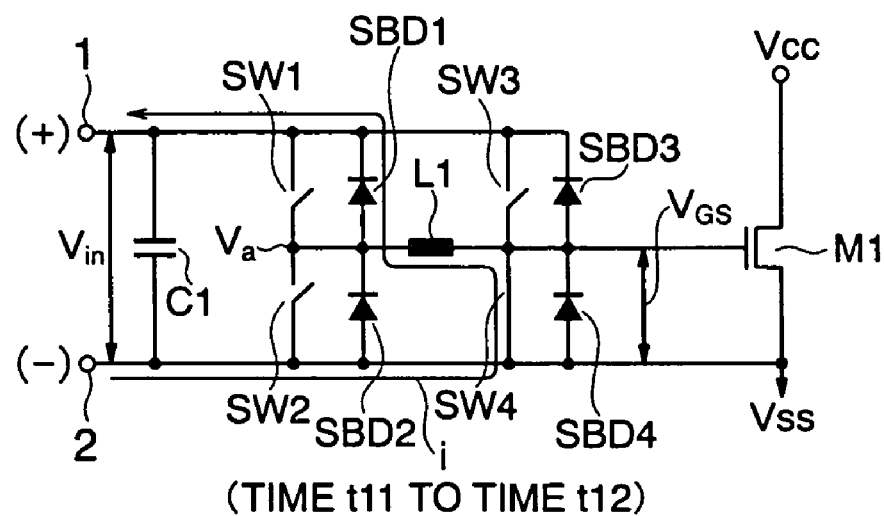
FIG. 12 is a view showing a circuit operation when a power MOSFET in the gate driving circuit is to be turned off.

8) The state shown in FIG. 12 is obtained from time t11 to time t12. In this period, the negative energy stored in the inductance L1 is regenerated until the electric current $I_L$ of the inductance L1 no longer flows.

After that, in the process of turning on the MOSFET M1 from time t12 to time t17, the same operation as in the process from time t1 to time t6 is performed. In the process of turning off the MOSFET M1 from time t18 to time t11, the same operation as in the process from time t7 to time t11 is performed.

In the first embodiment as described above, in each of the ON/OFF operations of the MOSFET M1, the positive/negative energy is once stored by supplying an electric current to the inductance element L1. When this electric current has reached a predetermined value, the positive/negative electric current flowing through the inductance element L1 is supplied to the gate of the MOSFET M1 to raise/drop the voltage of the gate having a capacitor structure. When the gate voltage has reached the input voltage/ground voltage, the electric current is commutated to the Schottky barrier diode SBD3/SBD4. While the electric current is thus commutated, the switching element SW4/SW3 is turned on to fix the gate voltage to the input voltage/ground voltage at a low impedance, thereby regenerating the energy stored in the inductance element L1 until the energy disappears.

By regenerating the energy stored in the inductance element L1 as described above, the gate driving loss can be greatly reduced.

Further, the gate driving loss can be reduced, because the loss cause by the gate resistance Rg is not generated.

In addition, since the switching element SW4 or SW3 is turned off after an electric current is supplied to the inductance element L1 in advance, it is possible to shorten the Miller time and reduce the switching loss of the MOSFET M1.

When the MOSFET M1 is OFF or ON, the gate electrode of the MOSFET M1 is fixed to the positive potential side or negative potential side of the input voltage Vin by the switching element SW3 or SW4 without using any resistor or inductance element. Accordingly, the gate voltage is not readily influenced by noise and does not easily change owing to variations in drain voltage of the MOSFET M1. This makes it possible to prevent faulty operations.

Also, in the conventional circuit, the value of the gate current Ig determined by the gate resistor cannot be changed.

By contrast, according to the first embodiment, the loss of the MOSFET M1 can be reduced by increasing the gate current.

First, the switching loss can be reduced if the gate driving time of the MOSFET M1 is shorter than its switching time. That is, the switching loss can be reduced if the charging time or discharging time of the parasitic capacitance of the gate of the MOSFET M1 is shorter than the switching time of the MOSFET M1, or if the gate capacitance is charged or discharged earlier than the start timing of switching of the MOSFET M1. For example, the switching loss of the MOSFET M1 can be greatly reduced by making the gate driving time about 1/10 the switching time.

Electric charge Qoss stored in the gate structure of the MOSFET is $$Qoss = Qds + Qdg \quad (1)$$

where Qds is electric charge stored in the parasitic capacitance in the drain-to-source path, and Qdg is electric charge stored in the drain-to-gate path (however, this electric charge is stored from 0 V to a voltage applied to the drain in the OFF state).

The switching time of the MOSFET M1 is $$tsw = Qoss/Id \quad (2)$$

where Id is the drain current when the MOSFET M1 is ON.

Actual gate driving time tdrive when the MOSFET is driven is determined by the time of swing from the gate voltage Vg(Id) to a threshold voltage Vth when the drain current Id flows.

The drain current Id is $$Id = gm(Vg(Id) - Vth) \quad (3)$$

Therefore, the gate driving time tdrive is $$tdrive = Id/gm/(dVg/dt) \quad (4)$$
$$= Id/gm * Cg/Ig$$

where Cg is the gate capacitance, Ig is the gate current, and gm is the conductance of the MOSFET.

When the above-mentioned condition, i.e., the condition that the gate driving time of the MOSFET M1 is 1/10 or less the switching time is taken into consideration, $$tdrive < 0.1 * tsw \quad (5)$$

From the above inequality, $$Id/gm * Cg/Ig < 0.1 * Qoss/Id \quad (6)$$

$$Ig > Id^2 * Cg/(gm * Qoss * 0.1) \quad (7)$$

By determining Ig in accordance with inequality (7), the switching loss of the MOSFET M1 can be greatly reduced.

In the above description, Qoss=Qds+Qdg. However, if diodes are connected in parallel, Qoss may also include electric charge stored in the junction capacitance of the diodes.

Also, if a capacitance element is connected in parallel with the MOSFET M1, Qoss may also include electric charge stored in this capacitance element.

Furthermore, Qoss may also include electric charge stored in the parasitic capacitance of any kind of electronic part (not shown) connected to the drain of the MOSFET M1, or electric charge stored in any existing parasitic capacitance.

To accurately control the dead time or the like, the gate voltage Vg itself must be changed more abruptly in order to avoid variations in threshold value of each element or in conductance gm of the transistor, and to avoid the influence of the parasitic capacitance. The conditions are as follows.

In inequality (6) related to the gate driving time tdrive described above, if Cg/Ig is replaced with complete transition time Qg/Ig of the gate, $$Qg/Ig < 0.1 * Qoss/Id \quad (8)$$

where Qg is electric charge stored in the gate by the gate capacitance.

As a consequence, the gate current Ig is $$Ig > Id * Qg/(Qoss * 0.1) \quad (9)$$

Note that when each of the switching elements SW1 to SW4 is formed by a MOSFET, the diodes SBD1 to SBD4 connected in parallel with these switching elements may also be built-in diodes of the MOSFETs. However, when the diodes SBD1 to SBD4 are Schottky barrier diodes, the switching loss can be further reduced.

Note also that in the first embodiment, during the period in which the energy stored in the inductance L1 is regenerated, i.e., during the period in which the switching elements SW2 and SW3 are simultaneously ON, it is possible to set a so-called synchronous commutation mode in which electric currents flow back to the MOSFETs forming the switching elements SW1 to SW4.

(2) SECOND EMBODIMENT

Figure 13:
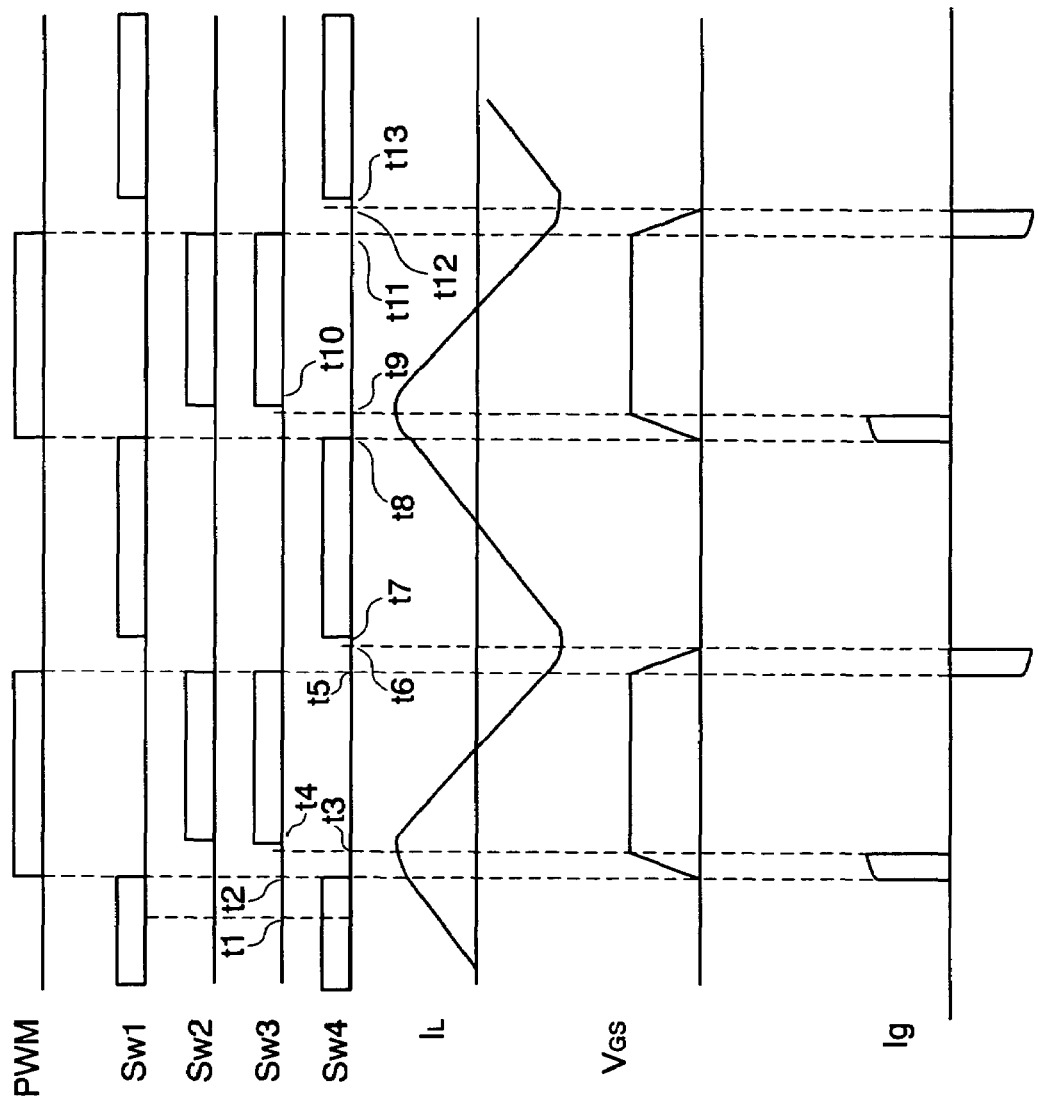
FIG. 13 is a timing chart showing, as the second embodiment of the present invention, another operation waveform of each signal in the first embodiment.

A gate driving circuit according to the second embodiment of the present invention will be described below. The second embodiment has the same circuit configuration as the first embodiment. However, as shown in FIG. 13, the waveforms of driving signals are different from those of the first embodiment.

In the process of turning on a MOSFET M1, both switching elements SW4 and SW1 are turned on to store energy in an inductance element L1.

Both the switching elements SW4 and SW1 are turned off at time t2 when the electric current of the inductance element L1 has reached a desired value to be supplied to the gate-to-source path of the MOSFET M1.

An electric current i having flown through the inductance element L1 flows into the gate of the MOSFET M1, and a gate voltage $V_{GS}$ rises.

When the gate voltage $V_{GS}$ has reached an input voltage Vin at time t3, the electric current i is commutated to a Schottky barrier diode SBD3.

At time t4, both switching elements SW2 and SW3 are turned on. The gate voltage $V_{GS}$ of the MOSFET M1 is fixed at the same level as the input voltage Vin. At time t5, both the switching elements SW2 and SW3 are turned off. Consequently, the gate voltage $V_{GS}$ of the MOSFET M1 drops and reaches the level of a ground voltage $V_{SS}$ at time t6.

The process of turning off the MOSFET M1 can be similarly controlled by replacing the switching element SW1 with the switching element SW2, and the switching element SW4 with the switching element SW3, in the turning-on sequence described above.

The second embodiment is equivalent to making the control mechanism simpler than in the first embodiment. Since the control mechanism is simple, the second embodiment is readily applicable even when the switching frequency is high.

As an example of an application, the second embodiment can be applied to an amplifier circuit of E class which is used for a high frequency power supply.

(3) THIRD EMBODIMENT

Figure 14:
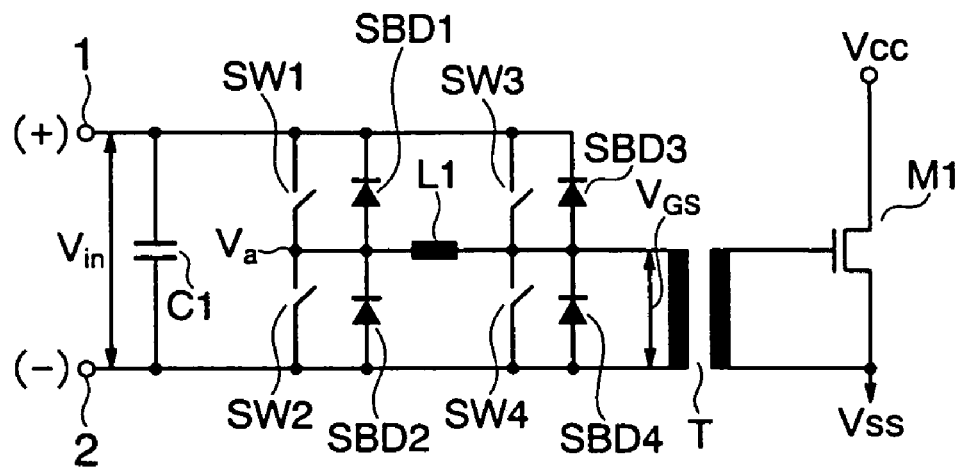
FIG. 14 is a circuit diagram showing the configuration of a gate driving circuit according to the third embodiment of the present invention.

FIG. 14 shows the configuration of a gate driving circuit according to the third embodiment of the present invention.

The third embodiment is an insulating type circuit in which a pulse transformer T is formed between the connecting point of the Schottky barrier diodes SBD3 and SBD4 and the ground voltage $V_{SS}$ terminal in the first embodiment.

Since the pulse transformer T is formed, a gate current Ig flows through the gate of a MOSFET M1 via the transformer. Therefore, the gate voltage rises when electric charge is stored in the gate capacitance, and drops when the stored electric charge is removed.

Similar to the first embodiment, the third embodiment can also reduce the gate driving loss, change the gate current to a desired value, and prevent faulty operations.

In addition, since insulation between the gate driving circuit and the MOSFET to be driven can be performed at the same time, the third embodiment is suited to driving a so-called high-side MOSFET, and the number of parts can be reduced. Note that in the third embodiment, the pulse width of an electric current is small as in the first embodiment, so the pulse transformer T can be downsized.

The driving sequence is the same as in the first embodiment, so an explanation thereof will be omitted.

(4) FOURTH EMBODIMENT

Figure 15:
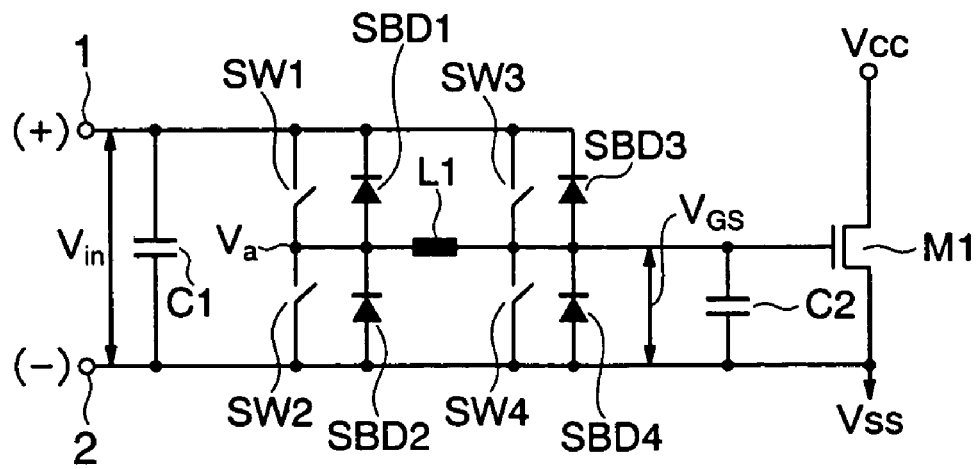
FIG. 15 is a circuit diagram showing the configuration of a gate driving circuit according to the fourth embodiment of the present invention.

FIG. 15 shows the configuration of a gate driving circuit according to the fourth embodiment of the present invention.

The fourth embodiment is equivalent to connecting a capacitance element C2 between the gate of the MOSFET M1 and the ground voltage $V_{SS}$ terminal in the first embodiment.

Since the capacitance element C2 is added, the capacitance of the capacitance element C2 is added to the capacitance by which electric charge is stored in the gate of the MOSFET M1. Consequently, it is possible to reduce the influence of variations in gate capacitance compared to the circuit to which the capacitance element C2 is not added.

No such capacitance element is added to any conventional gate driving circuit because the loss increases. In the fourth embodiment, however, the energy stored in this capacitance element is also regenerated similarly to the energy stored in the gate capacitance.

Accordingly, the fourth embodiment does not increase the loss even when the capacitance element C2 is added.

Note that the capacitance element C2 may also be formed by, e.g., using an oxide film on the chip of MOSFETs forming switching elements SW1 to SW4.

(5) FIFTH EMBODIMENT

Figure 16:
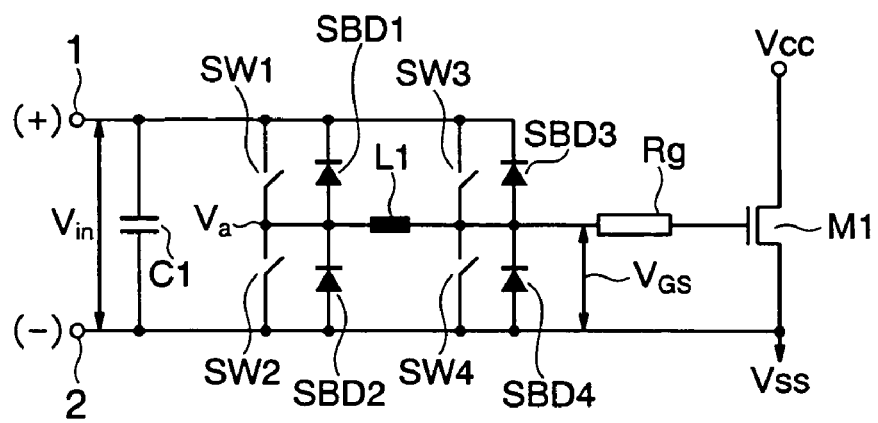
FIG. 16 is a circuit diagram showing the configuration of a gate driving circuit according to the fifth embodiment of the present invention.

FIG. 16 shows the configuration of a gate driving circuit according to the fifth embodiment of the present invention.

In the fifth embodiment, a resistor Rg is added between the connecting point of the Schottky barrier diodes SBD3 and SBD4 and the gate of the MOSFET M1 in the first embodiment.

The gate voltage of the MOSFET M1 sometimes fluctuates by the influence of the parasitic inductance of a driving line connected to the gate electrode. In this case, the insertion of the resistor Rg makes it possible to stabilize the gate voltage, and prevent variations in gate voltage caused by the parasitic inductance.

(6) SIXTH EMBODIMENT

Figure 17:
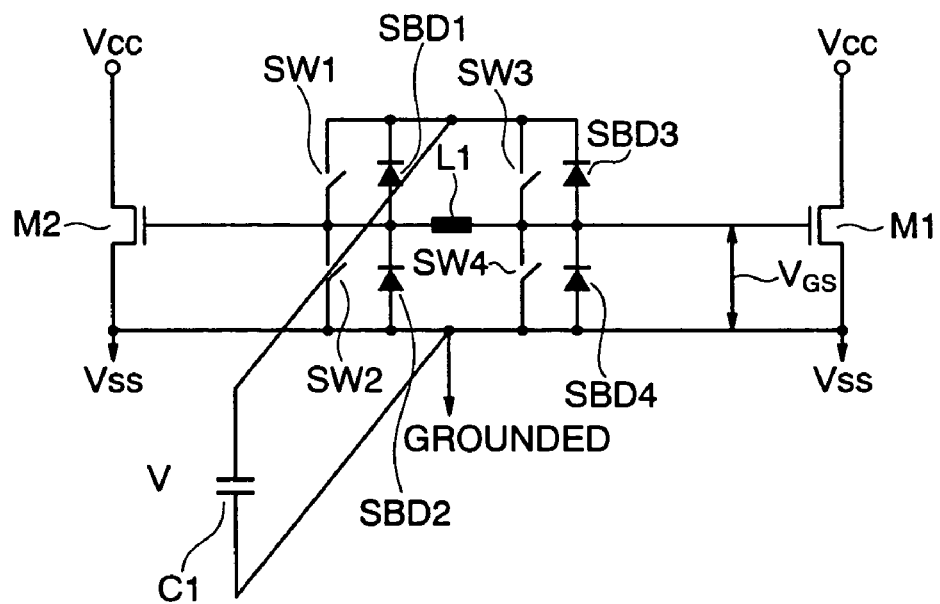
FIG. 17 is a circuit diagram showing the configuration of a gate driving circuit according to the sixth embodiment of the present invention.

FIG. 17 shows the configuration of a gate driving circuit according to the sixth embodiment of the present invention.

The sixth embodiment has an arrangement in which two MOSFETS M1 and M2 are driven by using the gate driving circuit according to the first embodiment. In a high-frequency power supply circuit and the like, the two MOSFETs M1 and M2 are often used with their sources grounded. The sixth embodiment is effective in a case like this.

In the gate driving circuit and gate driving method of the power MOSFET according to each embodiment described above, a bridge is formed by the first to fourth switches and first to fourth diodes. The inductance element L1 is connected between the connecting point of the first and second switches and the connecting point of the third and fourth switches. When the power MOSFET is to be turned on by the switching control circuit, the second switch is turned on while the fourth switch is kept ON, thereby supplying an electric current to the inductance element to store energy. When the electric current has reached a predetermined value, the fourth switch is turned off to raise the gate voltage of the MOSFET by the stored energy. After the fourth switch is turned on, the first switch is turned off to regenerate the stored energy. This makes it possible to reduce the driving loss, set the gate current at a desired value, and prevent faulty operations.

Note that each of the above embodiments is merely an example, and does not limit the present invention. Therefore, these embodiments can be modified within the technical scope of the present invention.

What is claimed is:

1. A gate driving circuit of a power MOSFET, comprising:
    a first capacitance element connected in series between a first higher voltage terminal and a first lower voltage terminal;
    a first switch connected in series between said first higher voltage terminal and a first node;
    a second switch connected in series between said first node and first lower voltage terminal;
    a first diode connected in parallel with said first switch, and having a cathode connected to said first higher voltage terminal and an anode connected to said first node;
    a second diode connected in parallel with said second switch, and having a cathode connected to said first node and an anode connected to said first lower voltage terminal;
    an inductance element connected in series between said first node and a second node;
    a third switch connected in series between said first higher voltage terminal and second node;
    a fourth switch connected in series between said second node and first lower voltage terminal;
    a third diode connected in parallel with said third switch, and having a cathode connected to said first higher voltage terminal and an anode connected to said second node;
    a fourth diode connected in parallel with said fourth switch, and having a cathode connected to said second node and an anode connected to said first lower voltage terminal; and
    a switching control circuit which controls ON/OFF operations of each of said first, second, third, and fourth switches,
    wherein in order to drive a power MOSFET having a drain and source connected between a second higher voltage terminal and a second lower voltage terminal, and a gate connected to said second node,
    said switching control circuit performs switching control such that a period during which said first and fourth switches are simultaneously ON and said fourth switch is turned OFF while said first switch remains ON exists prior to turning on said power MOSFET, and
    performs switching control such that another period during which said second and third switches are simultaneously ON exists prior to turning OFF said power MOSFET.

2. A circuit according to claim 1, wherein said first, second, third, and fourth switches are MOSFETs.

3. A circuit according to claim 1, wherein said first, second, third, and fourth diodes are Schottky baffler diodes.

4. A circuit according to claim 1, further comprising a second capacitance element connected across the gate and source of said power MOSFET.

5. A circuit according claim 1, further comprising a resistance element connected in series between the gate of said MOSFET and said second node.

6. A circuit according to claim 2, wherein said first, second, third, and fourth diodes are Schottky baffler diodes.

7. A circuit according to claim 2, further comprising a second capacitance element connected across the gate and source of said power MOSFET.

8. A circuit according claim 2, further comprising a resistance element connected in series between the gate of said MOSFET and said second node.

9. A circuit according to claim 1,
    wherein in order to drive the power MOSFET, said switching control circuit turns on said fourth switch, and turns on said first switch with said fourth switch being kept ON and said fourth switch is turned OFF while said first switch remains ON prior to turning ON said power MOSFET, thereby supplying a first electric current to said inductance element to store energy having a first polarity,
    turns off said fourth switch when the first electric current has reached a first predetermined value, thereby raising a gate voltage of said power MOSFET by the first polarity energy stored in said inductance element,
    turns on said third switch, and turns off said first switch to regenerate the first polarity energy stored in said inductance element, and
    said switching control circuit turns on said second switch with said third switch being kept ON prior to turning OFF said power MOSFET, thereby supplying a second electric current to said inductance element in a direction different from the first electric current and storing energy having a second polarity,
    turns off said third switch when the second electric current has reached a second predetermined value, thereby dropping the gate voltage of said power MOSFET by the second polarity energy stored in said inductance element,
    turns on said fourth switch, and turns off said second switch to regenerate the second polarity energy stored in said inductance element.

10. A circuit according to claim 9, wherein said first, second, third, and fourth switches are MOSFETs.

11. A circuit according to claim 9, wherein said first, second, third, and fourth diodes are Schottky barrier diodes.

12. A circuit according to claim 9, further comprising a second capacitance element connected across the gate and source of said power MOSFET.

13. A circuit according claim 9, further comprising a resistance element connected in series between the gate of said MOSFET and said second node.

14. A circuit according to claim 10, wherein said first, second, third, and fourth diodes are Schottky barrier diodes.

15. A circuit according to claim 10, further comprising a second capacitance element connected across the gate and source of said power MOSFET.

16. A circuit according claim 10, further comprising a resistance element connected in series between the gate of said MOSFET and said second node.

17. A gate driving method of a power MOSFET, which drives a power MOSFET by using a gate driving circuit, comprising:
- a first capacitance element connected in series between a first higher voltage terminal and a first lower voltage terminal;
- a first switch connected in series between the first higher voltage terminal and a first node;
- a second switch connected in series between the first node and first lower voltage terminal;
- a first diode connected in parallel with the first switch, and having a cathode connected to the first higher voltage terminal and an anode connected to the first node;
- a second diode connected in parallel with the second switch, and having a cathode connected to the first node and an anode connected to the first lower voltage terminal;
- an inductance element connected in series between the first node and a second node;
- a third switch connected in series between the first higher voltage terminal and second node;
- a fourth switch connected in series between the second node and first lower voltage terminal;
- a third diode connected in parallel with the third switch, and having a cathode connected to the first higher voltage terminal and an anode connected to the second node;
- a fourth diode connected in parallel with the fourth switch, and having a cathode connected to the second node and an anode connected to the first lower voltage terminal; and
- a switching control circuit which controls ON/OFF operations of each of the first, second, third, and fourth switches,
- the power MOSFET having a drain and source connected between a second higher voltage terminal and a second lower voltage terminal, and a gate connected to the second node,
- wherein the switching control circuit performs switching control such that a period during which the first and fourth switches are simultaneously ON and the fourth switch is turned OFF while the first switch remains ON exists prior to turning ON said power MOSFET, and
- performs switching control such that another period during which the second and third switches are simultaneously ON exists prior to turning OFF said power MOSFET.

18. A method according to claim 17, wherein when the power MOSFET is to be turned on, the switching control circuit turns on the fourth switch, and turns on the first switch with the fourth switch being kept ON, thereby supplying a first electric current to the inductance element to store energy having a first polarity,
turns off the fourth switch when the first electric current has reached a first predetermined value, thereby raising a gate voltage of the power MOSFET by the first polarity energy stored in the inductance element,
turns on the third switch, and turns off the first switch to regenerate the first polarity energy stored in the inductance element, and
when the power MOSFET is to be turned off, the switching control circuit turns on the second switch with the third switch being kept ON, thereby supplying a second electric current to the inductance element in a direction different from the first electric current and storing energy having a second polarity,
turns off the third switch when the second electric current has reached a second predetermined value, thereby dropping the gate voltage of the power MOSFET by the second polarity energy stored in the inductance element,
turns on the fourth switch, and turns off the second switch to regenerate the second polarity energy stored in the inductance element.

19. A circuit according to claim 1, wherein said first switch and said first diode are comprised in a first MOSFET, said second switch and said second diode are comprised in a second MOSFET, said third switch and said third diode are comprised in a third MOSFET, and said fourth switch and said fourth diode are comprised in a fourth MOSFET.

20. A circuit according to claim 9, wherein said first switch and said first diode are comprised in a first MOSFET, said second switch and said second diode are comprised in a second MOSFET, said third switch and said third diode are comprised in a third MOSFET, and said fourth switch and said fourth diode are comprised in a fourth MOSFET.

21. A gate driving circuit of a power MOSFET, comprising:
- a first capacitance element connected in series between a first higher voltage terminal and a first lower voltage terminal;
- a first switch connected in series between said first higher voltage terminal and a first node;
- a second switch connected in series between said first node and first lower voltage terminal;
- a first diode connected in parallel with said first switch, and having a cathode connected to said first higher voltage terminal and an anode connected to said first node;
- a second diode connected in parallel with said second switch, and having a cathode connected to said first node and an anode connected to said first lower voltage terminal;
- an inductance element connected in series between said first node and a second node;
- a third switch connected in series between said first higher voltage terminal and second node;
- a fourth switch connected in series between said second node and first lower voltage terminal;
- a third diode connected in parallel with said third switch, and having a cathode connected to said first higher voltage terminal and an anode connected to said second node;
- a fourth diode connected in parallel with said fourth switch, and having a cathode connected to said second node and an anode connected to said first lower voltage terminal;
- a transformer having a primary winding having a first terminal connected to said second node and a second terminal connected to said first lower voltage terminal; and
- a switching control circuit which controls ON/OFF operations of each of said first, second, third, and fourth switches,
- wherein in order to drive a power MOSFET having a drain connected to a second higher voltage terminal, a gate connected to a third terminal of a secondary winding of said transformer, and a source connected to a fourth terminal of the secondary winding of said transformer and to a second lower voltage terminal, said switching control circuit performs switching control such that a period during which said first and fourth switches are simultaneously ON and said fourth switch is turned OFF while said first switch remains ON exists prior to turning on said power MOSFET, and performs switching control such that another period during which said second and third switches are simultaneously ON exists prior to turning OFF said power MOSFET.

22. A circuit according to claim 21, wherein said first, second, third, and fourth switches are MOSFETs.

23. A circuit according to claim 21, wherein said first, second, third, and fourth diodes are Schottky barrier diodes.

24. A circuit according to claim 21, wherein said first switch and said first diode are comprised in a first MOSFET, said second switch and said second diode are comprised in a second MOSFET, said third switch and said third diode are comprised in a third MOSFET, and said fourth switch and said fourth diode are comprised in a fourth MOSFET.

25. A circuit according to claim 21, wherein in order to drive the power MOSFET, said switching control circuit turns on said fourth switch, and turns on said first switch with said fourth switch being kept ON and said fourth switch is turned OFF while said first switch remains ON prior to turning ON said power MOSFET, thereby supplying a first electric current to said inductance element to store energy having a first polarity, turns off said fourth switch when the first electric current has reached a first predetermined value, thereby raising a gate voltage of said power MOSFET by the first polarity energy stored in said inductance element, turns on said third switch, and turns off said first switch to regenerate the first polarity energy stored in said inductance element, and said switching control circuit turns on said second switch with said third switch being kept ON prior to turning OFF said power MOSFET, thereby supplying a second electric current to said inductance element in a direction different from the first electric current and storing energy having a second polarity, turns off said third switch when the second electric current has reached a second predetermined value, thereby dropping the gate voltage of said power MOSFET by the second polarity energy stored in said inductance element, turns on said fourth switch, and turns off said second switch to regenerate the second polarity energy stored in said inductance element.

26. A circuit according to claim 25, wherein said first switch and said first diode are comprised in a first MOSFET, said second switch and said second diode are comprised in a second MOSFET, said third switch and said third diode are comprised in a third MOSFET, and said fourth switch and said fourth diode are comprised in a fourth MOSFET.

* * * * *